United States Patent [19]

Tanaka et al.

[11] 3,997,832
[45] Dec. 14, 1976

[54] CIRCUIT FOR APPLYING STARTING VOLTAGE TO LOAD
[75] Inventors: Hiroaki Tanaka; Osamu Maida, both of Tokyo, Japan
[73] Assignee: Nippon Kogaku K.K., Tokyo, Japan
[22] Filed: July 9, 1975
[21] Appl. No.: 594,272
[30] Foreign Application Priority Data
July 17, 1974 Japan .............................. 49-81212
[52] U.S. Cl. ............................ 321/15; 307/110; 318/139; 320/1
[51] Int. Cl.² .................. H02M 3/06; H02M 3/155
[58] Field of Search ........... 321/15, 20, 2; 307/109, 307/110; 320/1; 318/139
[56] References Cited
UNITED STATES PATENTS

| | | | |
|---|---|---|---|
| 3,274,475 | 9/1966 | Poss | 320/1 |
| 3,560,820 | 2/1971 | Unnewehr | 318/139 X |
| 3,631,259 | 12/1971 | Kiyota | 321/15 |
| 3,805,143 | 4/1974 | Tauern et al. | 307/110 |
| 3,878,450 | 4/1975 | Greatbatch | 321/15 |
| 3,938,015 | 2/1976 | Beebe | 318/139 |

OTHER PUBLICATIONS (S30650006) Kuzmiszkina et al. *Preeglad Telekom*, Jan. 1973; pp. 23–28.

*Primary Examiner*—Gerald Goldberg
*Attorney, Agent, or Firm*—Fitzpatrick, Cella, Harper & Scinto

[57] ABSTRACT

A booster circuit applies a high voltage to a load for starting or energizing the load which is operated at a steady voltage once it has started. The booster circuit comprises a power source, a diode or a resistor provided in forward direction with respect to the power source, a first switch and a load. The booster circuit further comprises a capacitor which is charged by said power source through said diode when said first switch is opened and a second switch which is actuated upon closure of said first switch to connect said capacitor in parallel to said diode so that said diode is reversely biased by said capacitor.

3 Claims, 5 Drawing Figures

3,997,832

CIRCUIT FOR APPLYING STARTING VOLTAGE TO LOAD

BACKGROUND OF THE INVENTION

1. Field of the Invention

This invention relates to a booster circuit, and more particularly, to such a circuit for use in starting a DC motor or an electromagnetic trigger device for cameras.

2. Description of the Prior Art

In cinecameras in which a DC motor or an electromagnetic trigger device is used to drive the load, it is known to operate the release member by the attractive force of an electromagnet and to maintain such member in the attracted position during shooting. In such cases, it is often necessary to apply a high starting voltage only for starting the motor or the electromagnet and, after starting, to operate it at a steady but lower voltage. To meet such requirement, there is already proposed (in Japanese Patent Publication No. 4500/1972) a circuit in which a voltage of the DC source is boosted by an oscillator and a transformer to charge a capacitor by the boosted voltage so as to start a load such as a motor or electromagnet by the discharge energy of the capacitor, and thereafter the load is operated at a steady voltage from the power source. However, construction of such circuits are complicated since they require an oscillator and a transformer for obtaining the high voltage.

SUMMARY OF THE INVENTION

Accordingly, we have conceived by the present invention, an extremely simple booster circuit by which we are able to provide the necessary load starting voltage.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception upon which this disclosure is based may readily be utilized as a basis for the designing of other structures for carrying out the several purposes of the invention. It is important, therefore, that the claims be regarded as including such equivalent construction as do not depart from the spirit and scope of the invention.

BRIEF DESCRIPTION OF THE DRAWINGS

Specific embodiments of the invention have been chosen for purposes of illustration and description, and are shown in the accompanying drawings forming a part of the specification wherein.

DESCRIPTION OF THE PREFERRED EMBODIMENTS

The invention is now described in detail by way of some preferred embodiments thereof with reference to the accompanying drawings.

Figure 1:
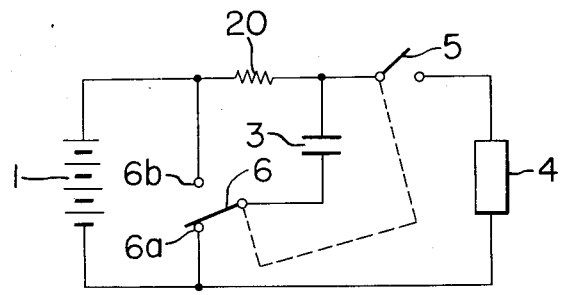
FIG. 1 is a circuit diagram showing a first embodiment of the invention.

Referring first to FIG. 1, the first embodiment of the present invention is seen to include switches 5 and 6 interlocked with each other so that when the power switch 5 is opened, the switch 6 is contacted with a contact 6a, and when the former is closed, the latter is contacted with a contact 6b.

When the power switch 5 is open as shown in the drawing, a starting capacitor 3 is charged substantially to the same level as the power source voltage by a power source 1 through a resistance 20 and the contact 6a, and then, when the power switch 5 is closed and the switch 6 is contacted with contact 6b, a load 4 such as for example a motor or electromagnet forms a closed circuit with the power source 1, switch 6 in contact with contact 6b, starting capacitor 3 and power switch 5. The moment the closed circuit is formed, the load 4 is charged with the combined voltage of the series-connected power source and capacitor; that is, with a voltage double that of the power source voltage to facilitate starting. After discharge of the starting capacitor 3 is completed, the load 4 is driven only by the power source 1 through resistance 20 to produce a normal operating condition. When power switch 5 is subsequently opened and switch 6 is in contact with contact 6a, the load is shut down and capacitor 3 is charged through resistance as said above.

Figure 2:
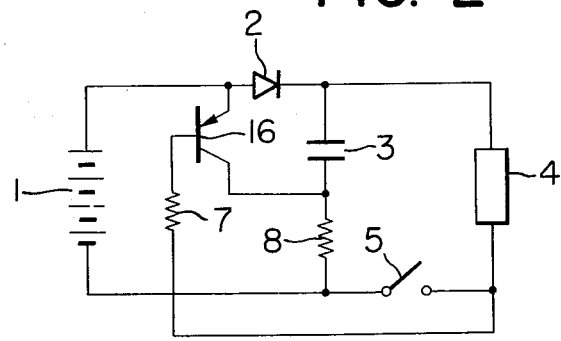
FIG. 2 is a circuit diagram showing a second embodiment of the invention.

Referring now to FIG. 2, there is shown a second embodiment of the present invention. In the above-described embodiment of FIG. 1, there are required interlocking switches and contact timing of respective switches is delicate, and hence an undesirable situation may occur wherein the starting voltage is applied after the steady voltage begins to be applied to the load. Also, since part of the discharge current of the capacitor 3 flows through resistance 20 with closure of power switch 5, there occurs a loss of energy of a corresponding amount.

In the circuit of FIG. 2, when power switch 5 is open, a transistor 16 connected to power source 1 through base resistance 7 and power switch 5, is in a shut-off condition, and capacitor 3 is charged by the battery 1 through diode 2 and resistance 8.

When power switch 5 is closed for starting the load 4, transistor 16 becomes conductive and capacitor 3 and battery 1 are connected in series with the load 4 to start it. Since diode 2 is reversely biased by capacitor 3, the discharge current thereof flows entirely to the load 4. Resistivity of resistance 8 is so set that the collector current of transistor 16 will flow substantially entirely to capacitor 3. Upon completion of discharge of capacitor 3, battery 1 is connected to the load 4 through diode 2 to bring the load to a normal operating condition. When power switch 5 is opened for deenergizing the load, capacitor 3 is charged by the operation already described.

Figure 3:
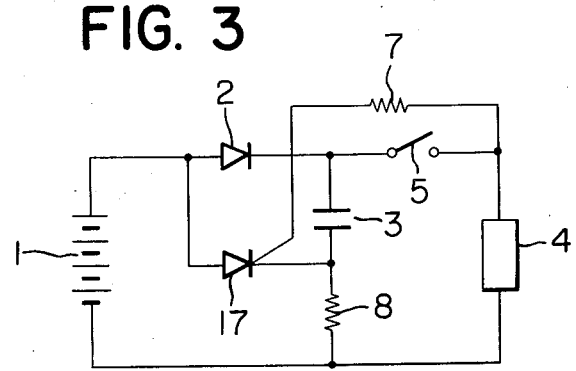
FIG. 3 is a circuit diagram showing a third embodiment of the invention.

FIG. 3 shows a third embodiment of the present invention wherein an SCR (silicone controlled rectifier) 17 is substituted for the transistor in the second embodiment. Capacitor 3 is charged in the same way as in the second embodiment.

When power switch 5 is closed to start the load, the terminal voltage of capacitor 3 is applied to the gate of the SCR 17 through resistance 7 to let the SCR 17 become conductive, whereupon capacitor 3 is connected in series to battery 1 to start the load 4. Upon completion of discharge of the capacitor 3, the load is operated in the same fashion as in the preceding embodiments. When power switch 5 is opened to deenergize the load, capacitor 3 is charged by the operation above-described.

Resistance 8 is selected such that when power switch 5 is opened, the current of the closed circuit formed by SCR 17, resistance 8 and battery 1, will be lower than the holding current.

In the foregoing three embodiments of the present invention, charging of capacitor 3 is effected through resistance 20 or 8, and hence, the charging time is somewhat prolonged.

Figure 4:
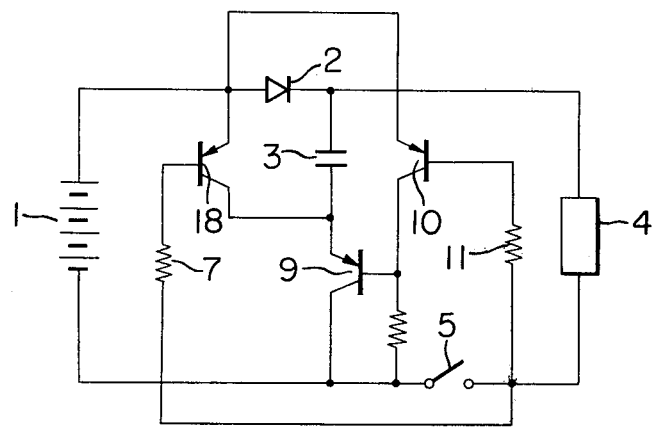
FIG. 4 is a circuit diagram showing a fourth embodiment of the invention.

In the circuit of FIG. 4, when power switch 5 is open, transistors 18 and 10 are shut off while transistor 9 remains conductive, and capacitor 3 is quickly charged by battery 1 through diode 2 and transistor 9, and then when power switch 5 is closed, transistor 10 becomes conductive and hence transistor 9 is shut off. As transistor 18 also simultaneously becomes conductive, capacitor 3 is connected in series to battery 1 to start the load 4. According to this embodiment, the collector current of transistor 18 is allowed to flow entirely to capacitor 3 by shut-off of transistor 9, used in lieu of resistance 8 in the second and third embodiments, and hence, little loss of energy is caused. After completion of discharge of capacitor 3, the normal operating condition is restored by the same operation as in the preceding embodiments.

When power switch 5 is opened to deactivate the circuit, capacitor 3 is charged in the same way as described before.

Figure 5:
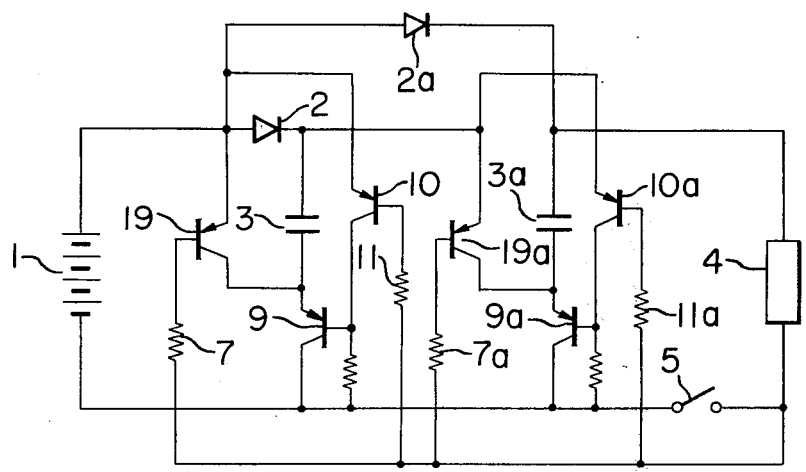
FIG. 5 is a circuit diagram showing a fifth embodiment of the invention.

Referring now to FIG. 5, there is shown a fifth embodiment of the present invention wherein two circuits of the fourth embodiment are used in combination to obtain a still higher starting voltage.

When power switch 5 is open, both capacitors 3 and 3a are charged to substantially the same level of voltage as the power source through conductive transistor 9 and diode 2 and conductive transistor 9a and diode 2a, respectively. Then, when power switch 5 is closed, transistors 19, 19a, and 10, 10a become conductive while transistors 9 and 9a become non-conductive, and diodes 2 and 2a are reversely biased by the respective associated capacitors 3 and 3a, thereby forming a closed circuit consisting of power source 1, transistor 19, capacitor 3, transistor 19a, capacitor 3a, load 4 and power switch 5, which are connected in that order. Thus, the load 4 is charged with a voltage almost thrice as high as the power source voltage and is thereby started. Then, when discharge of capacitors 3 and 3a is completed, diode 2a is biased forwardly and hence, the load 4 is connected to battery 1 through diode 2a to achieve the normal operating condition.

As apparent from the foregoing description, according to the present invention, application of a high voltage to the load for starting it is accomplished by connecting the power source to the capacitor, or capacitors as the case may be, charged thereby and to the load in series with each other, so that the construction of the circuit is extremely simplified.

We believe that the construction and operation of our novel circuit will now be understood and that the advantages thereof will be fully appreciated by those persons skilled in the art.

We claim:

1. A circuit for applying a starting voltage to a load wherein a higher voltage than a power source voltage is first applied to the load, and a voltage substantially equal to the power voltage is applied thereafter, said circuit comprising:
   a power switch operative to couple the load to said power source when said switch is in a closed state;
   a diode arranged to conduct current from said power source to said load;
   a capacitor having two terminals, one terminal thereof being coupled to said diode; and
   switching means coupled to said diode, said power source and to the other terminal of said capacitor, said means being responsive to the state of said power switch, for charging said capacitor from said power source through said diode when said power switch is in an open state, and for serially coupling said power source, said capacitor and said load so that the sum of said power voltage and the capacitor voltage is applied to said load when said power switch is in a closed state.

2. A circuit according to claim 1, wherein said switching means comprises a first semiconductor switch coupled in parallel with said diode and coupled to said power switch so that said first switch is triggered into a conductive state when said power switch is actuated to a closed state.

3. A circuit according to claim 2, wherein said switching means further comprises a second semiconductor switch serially coupled to said other terminal of said capacitor and coupled to said power switch so that said second switch is triggered into a nonconductive state when said power switch is actuated to a closed state.

* * * * *